United States Patent
Chiu

(10) Patent No.: US 8,143,731 B2
(45) Date of Patent: Mar. 27, 2012

(54) INTEGRATED ALIGNMENT AND OVERLAY MARK

(75) Inventor: Chui-Fu Chiu, Taoyuan (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 365 days.

(21) Appl. No.: 12/502,236

(22) Filed: Jul. 14, 2009

(65) Prior Publication Data

US 2011/0012271 A1    Jan. 20, 2011

(51) Int. Cl.
*H01L 23/544* (2006.01)

(52) U.S. Cl. ................. 257/797; 257/E23.179

(58) Field of Classification Search .......... 257/797
See application file for complete search history.

(56) References Cited

U.S. PATENT DOCUMENTS

| 6,710,876 | B1 * | 3/2004 | Nikoonahad et al. | 356/401 |
|---|---|---|---|---|
| 7,180,593 | B2 * | 2/2007 | Lin | 356/401 |
| 7,804,596 | B2 * | 9/2010 | Yoo | 356/401 |
| 2003/0174879 | A1 * | 9/2003 | Chen | 382/151 |
| 2005/0048741 | A1 * | 3/2005 | Phan et al. | 438/462 |
| 2005/0236721 | A1 * | 10/2005 | Yen et al. | 257/797 |
| 2005/0272221 | A1 * | 12/2005 | Yen et al. | 438/401 |

FOREIGN PATENT DOCUMENTS

| CN | 1445819 A | 10/2003 |
|---|---|---|
| CN | 1514306 A | 7/2004 |
| CN | 101398630 A | 4/2009 |
| TW | 200616131 | 5/2006 |

* cited by examiner

*Primary Examiner* — Lex Malsawma

(74) *Attorney, Agent, or Firm* — Winston Hsu; Scott Margo

(57) ABSTRACT

An integrated alignment and overlay mark includes a pre-layer pattern for reticle-to-wafer registration implemented in an exposure tool, and a current-layer pattern incorporated with the pre-layer pattern. The pre-layer pattern and the current-layer pattern constitute an overlay mark for determining registration accuracy between two patterned layers on a semiconductor wafer.

20 Claims, 4 Drawing Sheets

INTEGRATED ALIGNMENT AND OVERLAY MARK

BACKGROUND OF THE INVENTION

1. Field of the Invention

The present invention relates generally to the manufacture of semiconductor wafers. More specifically, the present invention relates to an integrated alignment and overlay pattern for determining the registration accuracy between two patterned layers on a semiconductor wafer.

2. Description of the Prior Art

As known in the art, lithographic process is an essential step that determines the feature critical dimension (CD) in the manufacture of semiconductor integrated circuit device. Ordinarily, electric circuit patterns are formed by first transferring the pattern on a photo mask to a photoresist layer in a lithographic process, and then transferring the pattern from the photoresist layer to an underlying material layer such as a dielectric layer or a metal layer in a subsequent etching process.

In order to increase production yield, alignment and overlay marks are typically provided on a wafer. By way of example, a sample wafer with alignment marks is put into product lines for testing alignment accuracy before wafers are practically in mass production. In the lithography process, the photo mask and the wafer are first aligned by an exposure tool using a set of pre-layer alignment marks typically located on a scribe line of the wafer. Then, the exposure tool detects the alignment marks and the reflected light signal is analyzed by the exposure tool to obtain precise alignment prior to the actual exposure process. The alignment mark typically includes a set of trenches etched into a material layer on a wafer.

After exposure, the photoresist layer on the wafer is then subjected to development process to form a photoresist pattern. Before implementing the etching process for transferring the photoresist pattern into the underlying material layer, it is important to check if the electric circuit feature defined in the developed photoresist layer perfectly matches with the electric circuit pattern previously formed on the wafer. The post-development accuracy of the alignment is evaluated in an overlay tool by taking overlay marks on a wafer as an overlay reference. The overlay mark, which is located in an area other than the alignment mark region, typically comprises a pre-layer pattern and a current-layer pattern arranged in a box-in-box configuration. The offset between a pre-layer pattern and the current-layer pattern can be measured by the overlay tool, and the exposure parameters can be adjusted with the feedback of the overlay alignment data from the overlay tool.

However, the above-described prior art has drawbacks. Since the alignment mark and overlay mark are respectively measured by different tools, i.e. the exposure tool and the overlay tool, the wafer stages and the detectors in each tool all have their own deviations. In other words, the measured results obtained from a single tool become more complicated due to the addition of the respective deviations and the total deviations become adversely enhanced. In addition, the overlay mark and the alignment mark region are located in different regions of a wafer. The separated alignment mark and overlay mark occupy valuable chip area and is thus not area efficient.

SUMMARY OF THE INVENTION

It is one object of the present invention to provide an integrated alignment and overlay mark capable of eliminating the measurement deviations between different measurement tools.

It is another object of the present invention to provide a relatively small alignment and overlay mark that is shrinkable and is more area efficient.

According to the claimed invention, an integrated alignment and overlay mark includes a pre-layer pattern for reticle-to-wafer registration implemented in an exposure tool, and a current-layer pattern incorporated with the pre-layer pattern. The pre-layer pattern and the current-layer pattern constitute an overlay mark for determining registration accuracy between two patterned layers on a semiconductor wafer.

In one aspect, in accordance with one embodiment of this invention, an integrated alignment and overlay mark includes a semiconductor wafer having thereon a first material layer and a second material layer overlying the first material layer; an alignment mark defined in the first material layer for reticle-to-wafer registration implemented in an exposure tool; and an overlay mark incorporating the alignment mark with a current-layer pattern defined in a photoresist layer on the second material layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
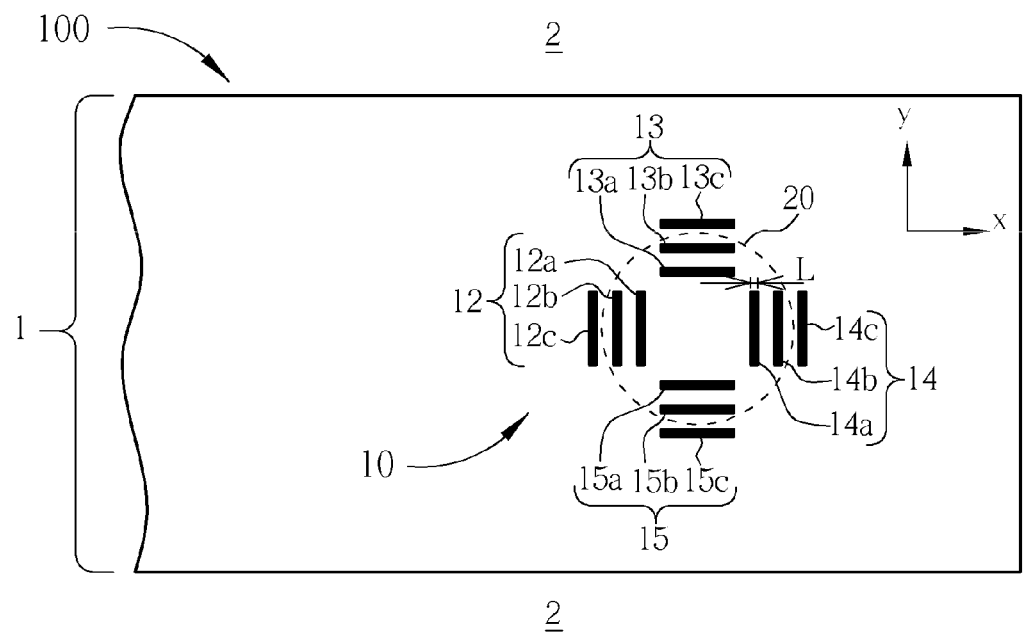
FIG. 1 is a schematic top view showing an enlarged portion of a scribe line on a semiconductor wafer according to one embodiment of this invention.

One or more implementations of the present invention will now be described with reference to the attached drawings, wherein like reference numerals are used to refer to like elements throughout, and wherein the illustrated structures are not necessarily drawn to scale.

Unless as otherwise defined herein, the term "alignment" is used to refer to the process of assuring reticle-to-wafer registration when the wafer is in the exposure tool. The term "overlay" refers to after-exposure (or post-development) measure of how accurately the process was carried out. The term "pre-layer" described in the instant application generally refers to a material layer processed in a previous lithography step, and the term "current-layer" described in the instant application refers to a material layer which is to be processed in the current lithography process.

FIG. 1 is a schematic top view showing an enlarged portion of a scribe line on a semiconductor wafer according to one embodiment of this invention. As shown in FIG. 1, a rectangular alignment mark 10 is provided within the kerf region or scribe line region 1 of the semiconductor wafer 100. The rectangular alignment mark 10 is used during the process of assuring reticle-to-wafer registration when the wafer is in the exposure tool. According to the embodiment of this invention, the dimension of the rectangular alignment mark 10 is about 40 μm×40 μm, and may be shrunk to about 10 μm×10 μm or even smaller depending on the design requirements and the detection means employed. In one embodiment, the shrinkable alignment mark 10 may be disposed within the active circuit die areas 2 adjacent to the scribe line region 1 to form an in-die alignment mark configuration.

The rectangular alignment mark 10 comprises a plurality of sets of slits (or bars) 12, 13, 14 and 15. Along the reference x-axis, the first set of the slits 12 comprises three slits: 12a, 12b and 12c, and the second set of slits 14 comprises three slits: 14a, 14b and 14c. At least the inner slit 12a and 14a and the middle slits 12b and 14b are located within the laser spot area 20, which is specifically indicated by dashed line. According to the embodiment of this invention, the laser employed may be KrF (193 nm) laser. Each of the slits has a line width "L", and the space between two adjacent slits is denoted as "S". According to the embodiment of this invention, the line width to space (L:S) ratio is about 1:3, preferably about 1:3 to 1:5. Likewise, along the reference y-axis, the third set of the slits 13 comprises three slits: 13a, 13b and 13c, and the fourth set of slits 15 comprises three slits: 15a, 15b and 15c. At least the inner slit 13a and 15a and the middle slits 13b and 15b are located within the laser spot area 20.

Figure 2:
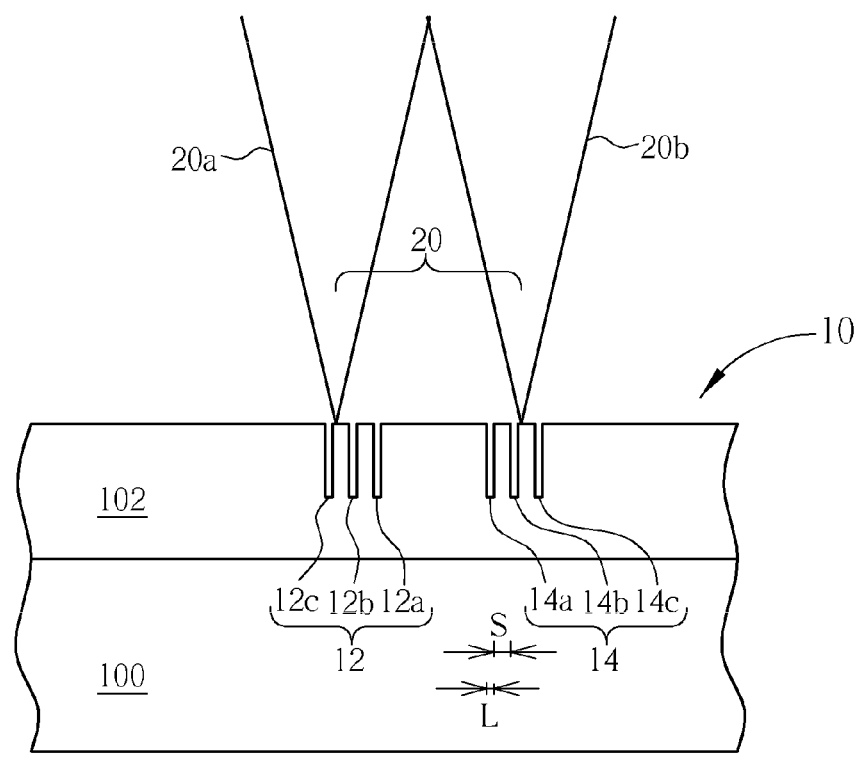
FIG. 2 shows an exemplary cross-sectional view of the rectangular alignment mark of FIG. 1.

As mentioned above, the rectangular alignment mark 10 is a pre-layer pattern that is used during the process of assuring reticle-to-wafer registration when the wafer is in the exposure tool. An exemplary cross-sectional view of the rectangular alignment mark 10 is shown in FIG. 2. As shown in FIG. 2, a material layer 102 such as a dielectric layer is provided on the semiconductor wafer 100. For the sake of simplicity, only the first set of the slits 12 comprising three slits: 12a, 12b and 12c, and the second set of slits 14 comprising three slits: 14a, 14b and 14c are demonstrated. The incident laser beam 20a and reflected laser beam 20b are also demonstrated.

Figure 3:
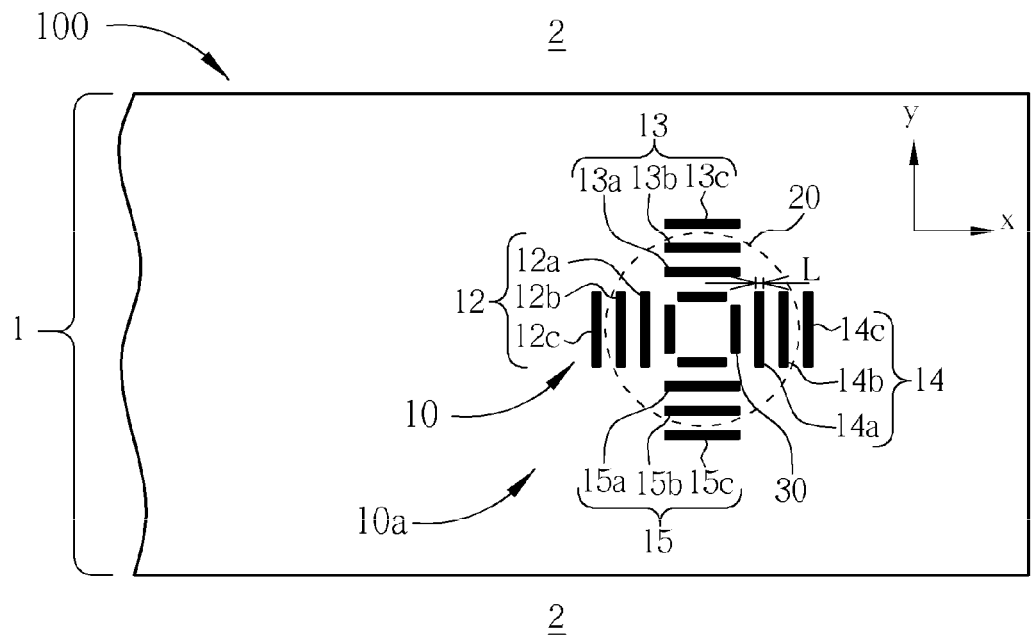
FIG. 3 is a schematic top view showing an overlay mark incorporating the rectangular alignment mark of FIG. 1 according to one embodiment of this invention.

FIG. 3 is a schematic top view showing an overlay mark incorporating the rectangular alignment mark 10 of FIG. 1 according to one embodiment of this invention. As shown in FIG. 3, a current-layer pattern 30 is formed in a central region of the rectangular alignment mark 10 to form a box-in-box overlay mark 10a. According to the embodiment of this invention, the current-layer pattern 30 is a developed photoresist pattern to be used to define the pattern in an underlying current-layer material film (not explicitly shown in FIG. 3).

Figure 4:
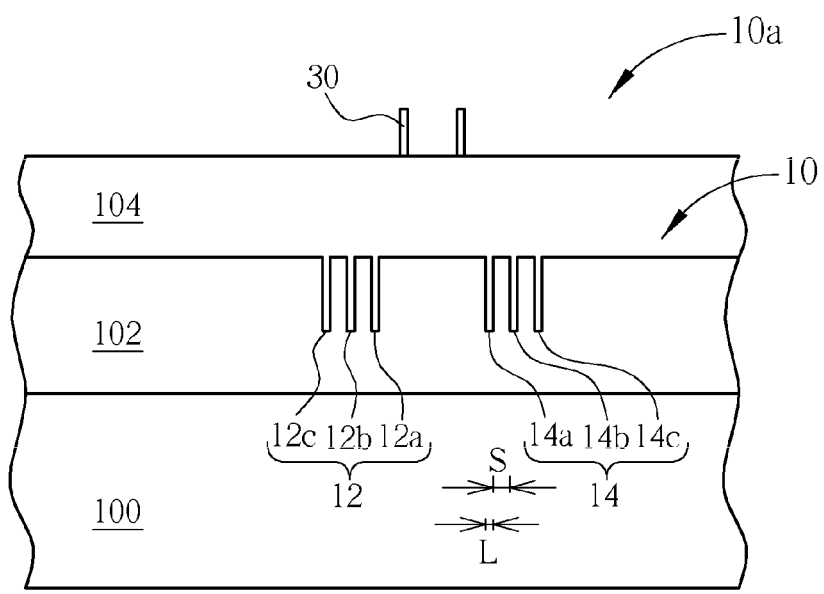
FIG. 4 shows an exemplary cross-sectional view of the overlay mark of FIG. 3.

An exemplary cross-sectional view of the overlay mark 10a is shown in FIG. 4. As shown in FIG. 4, a current-layer material film 104 is deposited over the rectangular alignment mark 10. The current-layer pattern 30, which is a developed photoresist pattern to be used to transfer a desired pattern into the underlying current-layer material film 104, is provided thereon. Since the overlay mark 10a incorporates the rectangular alignment mark 10 used in the exposure tool. The deviation between the alignment measure implemented in the exposure tool and the overlay measure implemented in the overlay tool can be alleviated or eliminated. The incorporation of the rectangular alignment mark 10 into the overlay mark 10a also save the chip area or kerf area.

Figure 5:
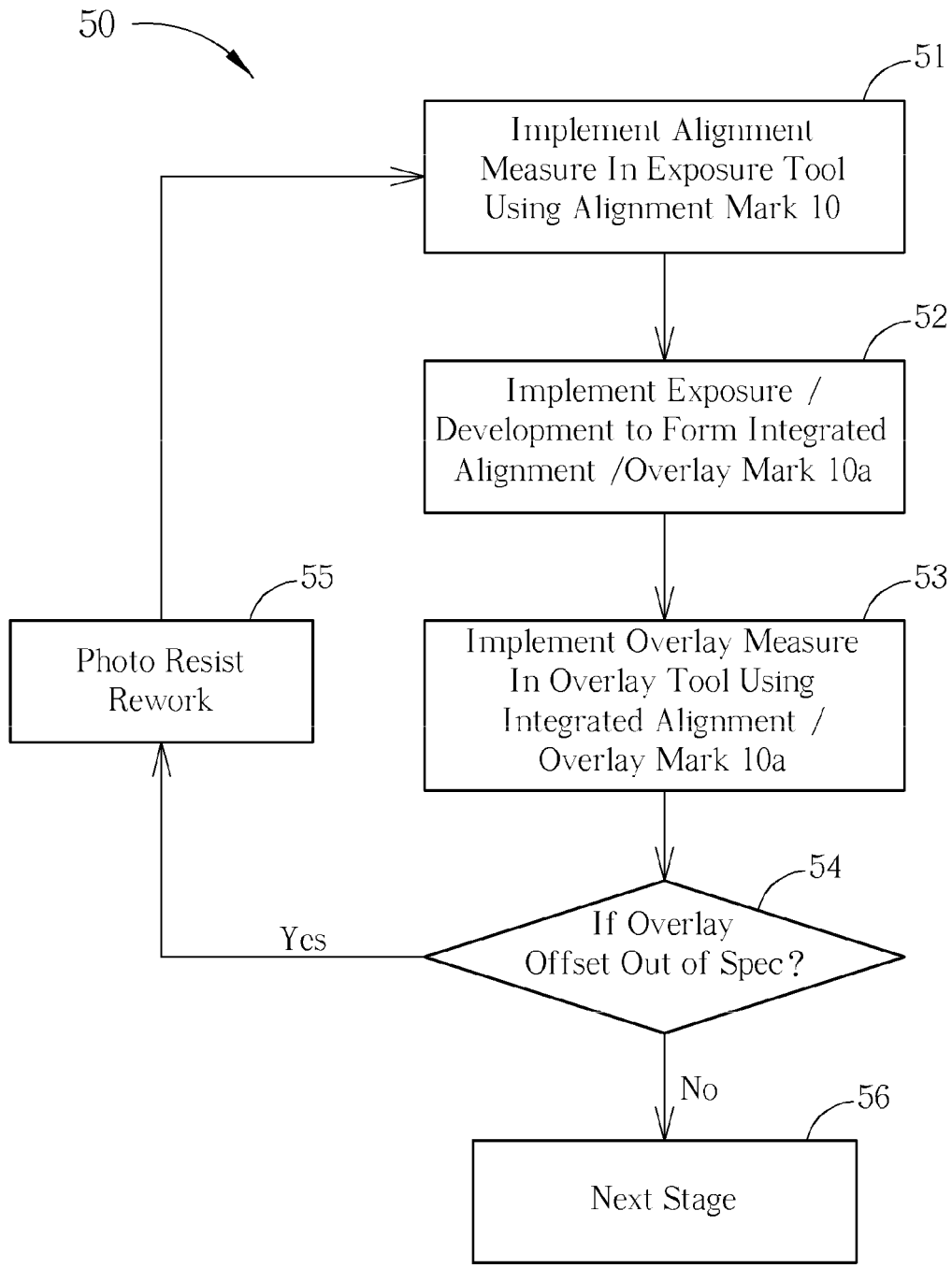
FIG. 5 is a flow chart demonstrating an exemplary process for fabricating a semiconductor device utilizing the novel integrated alignment and overlay mark in accordance with the preferred embodiment of this invention.

FIG. 5 is a flow chart demonstrating an exemplary process for fabricating a semiconductor device utilizing the novel integrated alignment and overlay mark in accordance with the preferred embodiment of this invention. As shown in FIG. 5, the process flow 50 includes the following steps:

Step 51: After the current-layer material film 104 is deposited on the semiconductor substrate or wafer, an alignment measure is carried out in the exposure tool using the alignment mark 10 to assure reticle-to-wafer registration.

Step 52: After the alignment process, a photoresist layer is coated on the current-layer material film 104 and is then subjected to exposure and development to form desired photoresist pattern on the current-layer material film 104. Simultaneously, a current-layer pattern 30 is formed overlying the alignment mark 10 thereby forming an integrated alignment and overlay mark 10a in the kerf region.

Step 53: After the exposure and development, an overlay measure is carried out in the overlay tool based on the integrated alignment and overlay mark 10a to determine the registration accuracy between the two patterned layers on the semiconductor wafer.

Step 54: If the measured overlay offset is out of specification, then proceed Step 55 and the data feedback to Step 51. If not, proceed Step 56.

Step 55: Photoresist rework.

Step 56: Next stage such as dry or wet etching process.

Figure 6:
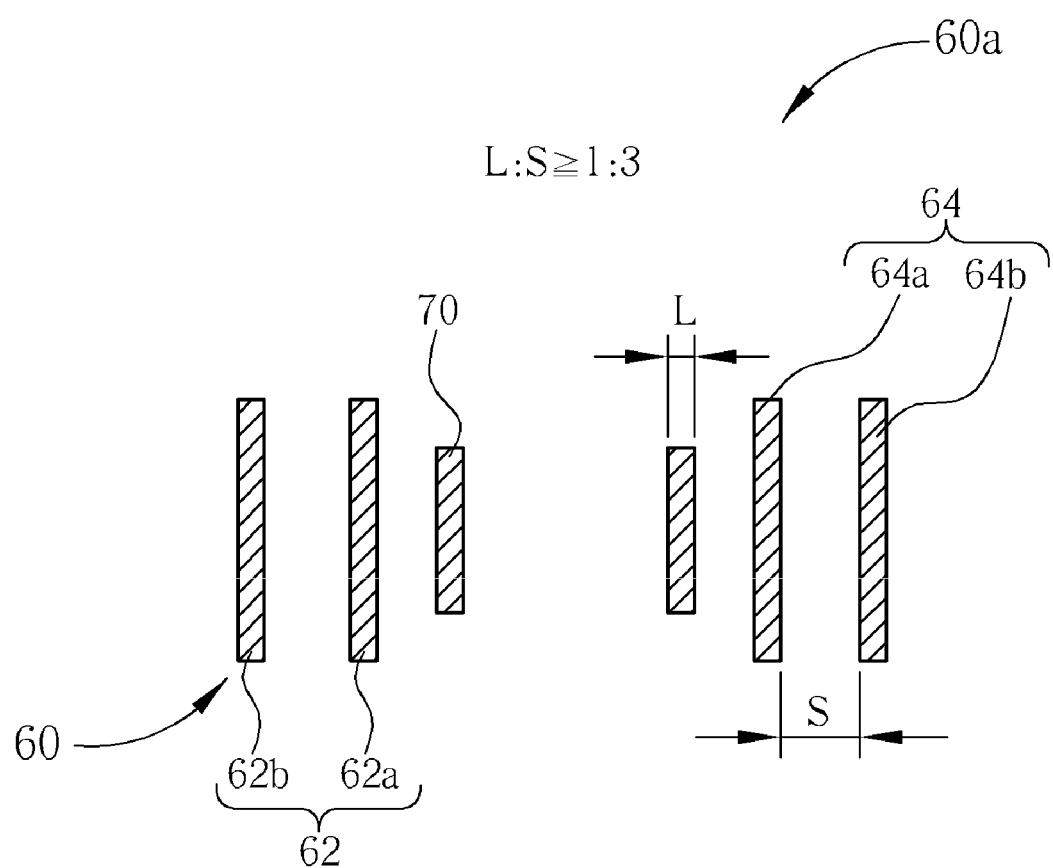
FIG. 6 is a schematic top view showing an integrated alignment and overlay mark according to another embodiment of this invention.

FIG. 6 is a schematic top view showing an integrated alignment and overlay mark according to another embodiment of this invention. As shown in FIG. 6, the integrated alignment and overlay mark 60a is basically a bar-in-bar configuration and comprises a pre-layer pattern 60 that is used as an alignment mark in an exposure tool, and a current-layer pattern 70. The pre-layer pattern 60 comprises two sets of slits (or bars) 62 and 64. The first set of the slits 62 (on the left hand side) comprises at least two slits: 62a, 62b, and the second set of slits 14 (on the right hand side) comprises at least two slits: 64a, 64b. According to the embodiment of this invention, the current-layer pattern 60 is a developed photoresist pattern to be used to define the pattern in an underlying current-layer material film (not explicitly shown in FIG. 6).

Those skilled in the art will readily observe that numerous modifications and alterations of the device and method may be made while retaining the teachings of the invention.

What is claimed is:

1. An integrated alignment and overlay mark, comprising:
   a pre-layer pattern for reticle-to-wafer registration implemented in an exposure tool, wherein the pre-layer pattern comprises a plurality of sets of slits or bars, and wherein at least two slits or bars of each set that are closest to a center of the integrated alignment and overlay mark are within a laser spot area; and
   a current-layer pattern incorporated with said pre-layer pattern, said pre-layer pattern and said current-layer pattern constitute an overlay mark for determining registration accuracy between two patterned layers on a semiconductor wafer.

2. The integrated alignment and overlay mark according to claim 1 wherein said pre-layer pattern and said current-layer pattern are both formed in a kerf region.

3. The integrated alignment and overlay mark according to claim 1 wherein said pre-layer pattern and said current-layer pattern are both formed within an active circuit die area.

4. The integrated alignment and overlay mark according to claim 1 wherein said pre-layer pattern comprises a plurality of sets of slits.

5. The integrated alignment and overlay mark according to claim 4 wherein said plurality of sets of slits are arranged in a box shape thereby forming a rectangular pre-layer pattern.

6. The integrated alignment and overlay mark according to claim 4 wherein each of said slits has a line width L, and has a space S between two adjacent said slits, wherein the line width to space (L:S) ratio is about 1:3.

7. The integrated alignment and overlay mark according to claim 1 wherein said current-layer pattern is disposed in a central region of the pre-layer pattern.

8. The integrated alignment and overlay mark according to claim 1 wherein said integrated alignment and overlay mark has a dimension of about 40 μm×40 μm.

9. The integrated alignment and overlay mark according to claim 1 wherein said integrated alignment and overlay mark has a dimension of smaller than 40 μm×40 μm.

10. The integrated alignment and overlay mark according to claim 1 wherein said pre-layer pattern is formed in a first material layer on the semiconductor wafer.

11. The integrated alignment and overlay mark according to claim 10 wherein a second material layer is deposited over the first material layer, and said current-layer pattern is formed in a photoresist layer coated on said second material layer.

12. An integrated alignment and overlay mark, comprising:
a semiconductor wafer having thereon a first material layer and a second material layer overlying said first material layer;
an alignment mark defined in said first material layer for reticle-to-wafer registration implemented in an exposure tool, wherein the alignment mark comprises a plurality of sets of slits or bars, and wherein at least two slits or bars of each set that are closest to a center of the integrated alignment and overlay mark are within a laser spot area; and
an overlay mark incorporating said alignment mark with a current-layer pattern defined in a photoresist layer on said second material layer.

13. The integrated alignment and overlay mark according to claim 12 wherein said integrated alignment and overlay mark is disposed in a kerf region.

14. The integrated alignment and overlay mark according to claim 12 wherein said integrated alignment and overlay mark is disposed within an active circuit die area.

15. The integrated alignment and overlay mark according to claim 12 wherein said alignment mark consists of a plurality of sets of slits.

16. The integrated alignment and overlay mark according to claim 15 wherein said plurality of sets of slits are arranged in a box shape.

17. The integrated alignment and overlay mark according to claim 15 wherein each of said slits has a line width L, and has a space S between two adjacent said slits, wherein the line width to space (L:S) ratio is about 1:3.

18. The integrated alignment and overlay mark according to claim 12 wherein said current-layer pattern is disposed in a central region of the alignment mark.

19. The integrated alignment and overlay mark according to claim 12 wherein said integrated alignment and overlay mark has a dimension of about 40 μm×40 μm.

20. The integrated alignment and overlay mark according to claim 12 wherein said integrated alignment and overlay mark has a dimension of smaller than 40 μm×40 μm.

* * * * *